United States Patent
Whitney et al.

(10) Patent No.: US 8,660,164 B2
(45) Date of Patent: Feb. 25, 2014

(54) METHOD AND SYSTEM FOR AVOIDING PACKAGE INDUCED FAILURE IN SWEPT SEMICONDUCTOR SOURCE

(75) Inventors: Peter S. Whitney, Lexington, MA (US); Dale C. Flanders, Lexington, MA (US)

(73) Assignee: Axsun Technologies, Inc., Billerica, MA (US)

(*) Notice: Subject to any disclaimer, the term of this patent is extended or adjusted under 35 U.S.C. 154(b) by 0 days.

(21) Appl. No.: 13/428,826

(22) Filed: Mar. 23, 2012

(65) Prior Publication Data

US 2012/0257210 A1 Oct. 11, 2012

Related U.S. Application Data

(60) Provisional application No. 61/467,312, filed on Mar. 24, 2011.

(51) Int. Cl.
*H01S 3/08* (2006.01)

(52) U.S. Cl.
USPC ............... 372/102; 372/98; 372/33; 372/25; 372/29.01; 372/50.1

(58) Field of Classification Search
USPC ............... 372/25, 29.01, 33, 50.1, 102, 98
See application file for complete search history.

(56) References Cited

U.S. PATENT DOCUMENTS

| | | |
|---|---|---|
| 5,392,305 A | 2/1995 | Jakobson |
| 5,513,198 A | 4/1996 | Jakobson |
| 5,629,952 A | 5/1997 | Bartholomew et al. |
| 5,696,785 A | 12/1997 | Bartholomew et al. |
| 5,770,473 A * | 6/1998 | Hall et al. .......... 438/26 |
| 6,123,464 A | 9/2000 | Murata et al. |
| 6,200,692 B1 | 3/2001 | Tamura et al. |
| 6,220,767 B1 | 4/2001 | Bookbinder |
| 6,373,632 B1 | 4/2002 | Flanders |
| 6,387,723 B1 | 5/2002 | Payne et al. |
| 6,396,023 B1 | 5/2002 | Aikiyo |
| 6,590,283 B1 | 7/2003 | Zolnowski |
| 6,608,711 B2 | 8/2003 | Flanders et al. |
| 6,660,552 B2 | 12/2003 | Payne et al. |
| 6,764,875 B2 | 7/2004 | Shook |
| 6,767,751 B2 | 7/2004 | Hunter |
| 6,806,997 B1 | 10/2004 | Dueweke et al. |
| 6,813,059 B2 | 11/2004 | Hunter et al. |

(Continued)

OTHER PUBLICATIONS

Jayaraman, V. et al., "Design and performance of broadly tunable, narrow line-width, high repetition rate 1310nm VCSELs for swept source optical coherence tomography," Proc. of SPIE, vol. 8276, 2012, pp. 82760D-1-82760D-11.

(Continued)

*Primary Examiner* — Kinam Park
(74) *Attorney, Agent, or Firm* — Houston & Associates, LLP

(57) ABSTRACT

Dry oxygen, dry air, or other gases such as ozone are hermetically sealed within the package of the external cavity laser or ASE swept source to avoid packaging-induced failure or PIF. PIF due to hydrocarbon breakdown at optical interfaces with high power densities is believed to occur at the SLED and/or SOA facets as well as the tunable Fabry-Perot reflector/filter elements and/or output fiber. Because the laser is an external cavity tunable laser and the configuration of the ASE swept sources, the power output can be low while the internal power at surfaces can be high leading to PIF at output powers much lower than the 50 mW.

15 Claims, 3 Drawing Sheets

(56) References Cited

U.S. PATENT DOCUMENTS

| | | |
|---|---|---|
| 6,829,077 B1 | 12/2004 | Maheshwari |
| 6,829,258 B1 | 12/2004 | Carlisle et al. |
| 6,872,984 B1 | 3/2005 | Leung |
| 6,876,683 B2 | 4/2005 | Watanabe et al. |
| 6,901,095 B2 * | 5/2005 | Tsunetomo et al. ....... 372/43.01 |
| 6,908,201 B2 | 6/2005 | Gudeman et al. |
| 6,922,272 B1 | 7/2005 | de Groot et al. |
| 6,928,207 B1 | 8/2005 | Trisnadi et al. |
| 6,930,364 B2 | 8/2005 | Bruner |
| 6,934,070 B1 | 8/2005 | Maheshwari et al. |
| 6,956,878 B1 | 10/2005 | Trisnadi |
| 6,987,600 B1 | 1/2006 | Maheshwari |
| 6,988,001 B2 * | 1/2006 | Greatbatch et al. ................ 607/9 |
| 7,049,164 B2 | 5/2006 | Bruner |
| 7,057,795 B2 | 6/2006 | Hunter et al. |
| 7,057,819 B1 | 6/2006 | Maheshwari |
| 7,061,618 B2 | 6/2006 | Atia et al. |
| 7,068,372 B1 | 6/2006 | Trisnadi et al. |
| 7,160,368 B1 | 1/2007 | Wakelin |
| 7,177,081 B2 | 2/2007 | Tomita et al. |
| 7,286,764 B1 | 10/2007 | Trisnadi et al. |
| 7,391,973 B1 | 6/2008 | Corrigan et al. |
| 7,415,049 B2 | 8/2008 | Flanders et al. |
| 7,553,355 B2 | 6/2009 | Torres, Jr. et al. |
| 7,560,820 B2 | 7/2009 | Amiotti et al. |
| 7,573,924 B2 | 8/2009 | Tsuda et al. |
| 7,804,880 B2 | 9/2010 | Ito et al. |
| 7,843,976 B2 * | 11/2010 | Cable et al. ..................... 372/20 |
| 2006/0203859 A1 | 9/2006 | Cable et al. |
| 2011/0051143 A1 * | 3/2011 | Flanders et al. .............. 356/451 |

OTHER PUBLICATIONS

Potsaid, B. et al., "MEMS tunable VCSEL light source for ultrahigh speed 60kHz-1MHz axial scan rate and long range centimeter class OCT imaging," Proc. of SPIE, vol. 8213, 2012, pp. 82130M-1-82130M-8.

Sharps, J. A. et al., "Effects of packaging atmosphere and organic contamination on 980 nm laser diode reliability," Optical Society of America/Optical Amplifiers and Their Applications, 1994, pp. 46/WD5-1-481WD5-3.

\* cited by examiner

METHOD AND SYSTEM FOR AVOIDING PACKAGE INDUCED FAILURE IN SWEPT SEMICONDUCTOR SOURCE

RELATED APPLICATIONS

This application claims the benefit under 35 USC 119(e) of U.S. Provisional Application No. 61/467,312, filed on Mar. 24, 2011, which is incorporated herein by reference in its entirety.

BACKGROUND OF THE INVENTION

Optical coherence analysis relies on the use of the interference phenomena between a reference wave and an experimental wave or between two parts of an experimental wave to measure distances and thicknesses, and calculate indices of refraction of a sample. Optical Coherence Tomography (OCT) is one example technology that is used to perform high-resolution cross sectional imaging. It is often applied to imaging biological tissue structures, for example, on microscopic scales in real time. Optical waves are reflected from an object or sample and a computer produces images of cross sections of the sample by using information on how the waves are changed upon reflection.

Fourier domain OCT (FD-OCT) currently offers the best performance for many applications. Moreover, of the Fourier domain approaches, swept-source OCT has distinct advantages over techniques such as spectrum-encoded OCT because it has the capability of balanced and polarization diversity detection. It has advantages as well for imaging in wavelength regions where inexpensive and fast detector arrays, which are typically required for spectrum-encoded FD-OCT, are not available.

In swept source OCT, the spectral components are not encoded by spatial separation, but they are encoded in time. The spectrum is either filtered or generated in successive frequency steps and reconstructed before Fourier-transformation. Using the frequency scanning swept source, the optical configuration becomes less complex but the critical performance characteristics now reside in the source and especially its frequency tuning speed and accuracy.

High speed frequency tuning for OCT swept sources is especially relevant to in vivo imaging where fast imaging reduces motion-induced artifacts and reduces the length of the patient procedure. It can also be used to improve resolution.

The swept sources for OCT systems have typically been tunable lasers. The advantages of tunable lasers include high spectral brightness and relatively simple optical designs. A tunable laser is constructed from a gain medium, such as a semiconductor optical amplifier (SOA), which is located within a resonant cavity, and a tunable element such as a rotating grating, grating with a rotating mirror, or a Fabry-Perot tunable filter. Currently, some of the highest tuning speed lasers are based on the designs described in U.S. Pat. No. 7,415,049 B1, entitled Laser with Tilted Multi Spatial Mode Resonator Tuning Element, by D. Flanders, M. Kuznetsov and W. Atia. The use of micro-electro-mechanical system (MEMS) Fabry-Perot tunable filters combines the capability for wide spectral scan bands with the low mass, high mechanical resonant frequency deflectable MEMS membranes that have the capacity for high speed tuning.

Another class of swept sources that have the potential to avoid some of the inherent drawbacks of tunable lasers, such as sweep speed limitations, is filtered amplified spontaneous emission (ASE) sources that combine a spectrally broadband light source, typically a source that generates light by ASE such as a superluminescent light emitting diode (SLED), with tunable optical filters and optical amplifiers. Some of the highest speed, and most integrated devices based on filtered ASE sources are described in U.S. Pat. No. 7,061,618 B2, entitled Integrated Spectroscopy System, by W. Atia, D. Flanders P. Kotidis, and M. Kuznetsov. A number of variants of the filtered ASE swept source are described, including amplified versions and versions with tracking filters. More recently, U.S. Pat. Appl. Publ. No. 2011/0051143 A1, filed on May 8, 2010, entitled ASE Swept Source with Self-Tracking Filter for OCT Medical Imaging, by D. Flanders, W. Atia, and M. Kuznetsov, which is incorporated herein in its entirety by this reference, lays out various integrated, high speed filtered ASE swept source configurations, including self-tracking filters.

SUMMARY OF THE INVENTION

A common wavelength for OCT swept sources is centered on 1060 nanometers (nm). The SLED's and SOA's in this wavelength are typically fabricated from GaAs chips. These chips often cover a range including 970-1100 nm.

While the swept sources for OCT applications are often relatively low power devices, having output powers of less than 50 milliWatts (mW) of output optical power, experience has demonstrated that failures occur. It is believed that these failures are packaging induced failures (PIF).

In current tunable lasers, getters are used to capture, e.g., absorb/adsorb, moisture. Currently, the getters do not absorb hydrogen or hydrocarbons.

Despite the fact that the optical output is less than 50 mW, such as 30-40 mW, or less, the optical power seen by optical elements within the lasers or ASE swept sources are higher, typically two to three times higher. This is due to the external cavity configuration in the case of the lasers since light resonates within the cavity and only a portion of that light present as output optical power. In the case of the ASE swept sources, light may circulate through loops or stubs.

Still higher powers are present in any resonant filter elements. The ratio of the optical power inside a Fabry Perot filter versus outside the filter is roughly the same as the finesse of the filter, which is typically in the range 500-5000. The optical mode diameter is typically on the order of 1-2 micrometers in diameter at the facet of a laser diode, SLED, or SOA, and on the order of 10-20 micrometers diameter in a microelectromechanical (MEMS) Fabry Perot tunable filter. Thus the spot area is roughly 100 times higher inside the FP filter cavity.

This means the optical power density inside the FP cavity can be 10-100 times higher than the facet of a laser diode, SLED, or SOA at the same overall device output optical power, as is otherwise present in the external cavity laser.

Therefore, the same type of failure mechanism as seen on high power 980 nm pump lasers at greater than 50 mW can also take place in an external cavity laser, ASE swept source, and/or MEMS tunable filter, even with sources that generate less than 50 mW of optical power.

According to the invention, dry oxygen, dry air, or other gases such as ozone are hermetically sealed within the package of the external cavity laser or ASE swept source to avoid packaging-induced failure or PIF. PIF due to hydrocarbon breakdown at optical interfaces with high power densities. It can occur at the SLED and/or SOA facets as well as the tunable Fabry-Perot reflector/filter elements and/or output fiber. Because the laser is an external cavity tunable laser and the configuration of the ASE swept sources, the power output can be low while the internal power at surfaces can be high leading to PIF at output powers much lower than the 50 mW. The oxygen will combine with any free carbon in the package to avoid its deposition on any optical surfaces that transmit or reflect light.

In one embodiment, the oxygen content within the package is about 20%, or preferably between 10-50%.

In other embodiments, PIF is minimized by exposing the hermetic package to an ozone cleaning prior to lid sealing to eliminate trace organics. Further, the packages are preferably baked at 200 C-250 C for roughly 100 hrs to drive out residual hydrogen from the package during the manufacturing process. Hydrogen can be problematic when lid sealing with oxygen present, since it combines with the oxygen to produce internal moisture. Moisture in the presence of oxygen will result in corrosion, especially of metal joints, such as certain solders and thermo-electric coolers.

In a further embodiment, in addition to a moisture getter to reduce the internal moisture, the getter or an additional getter is used to reduce hydrogen and/or volatile organics.

In the current embodiment, the tunable laser or ASE swept source comprises a semiconductor gain medium, such as an SOA, and a tuning element such as a MEMS Fabry-Perot tunable filter for controlling a frequency of the tunable swept optical signal. The tunable source is located in a hermetic package with provisions for absorbing any carbon or carbon species. This is accomplished using oxygen in the package, which combines with carbon to produce carbon dioxide, and/or carbon getters.

In other embodiments, such as the case of a tunable vertical cavity surface emitting laser (VCSEL), the laser cavity may be very short, on the order of 1-10 micrometers. In this case as well, there are multiple air-to-solid interfaces inside the optical cavity which are potentially impacted by the degradation mechanism leading to PIF.

In general, according to another aspect, the invention features a method for configuring an optical coherence tomography system. The method comprises providing a swept source that includes a hermetic package, an optical bench within the hermetic package, a semiconductor gain chip installed on the optical bench for generating light, and a tunable filter installed on the bench for filtering the light from the semiconductor gain chip to generate a swept optical signal. The hermetic package is filled with an atmosphere that contains oxygen and a swept optical signal generated with the swept source. The signal is transmitted an interferometer.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
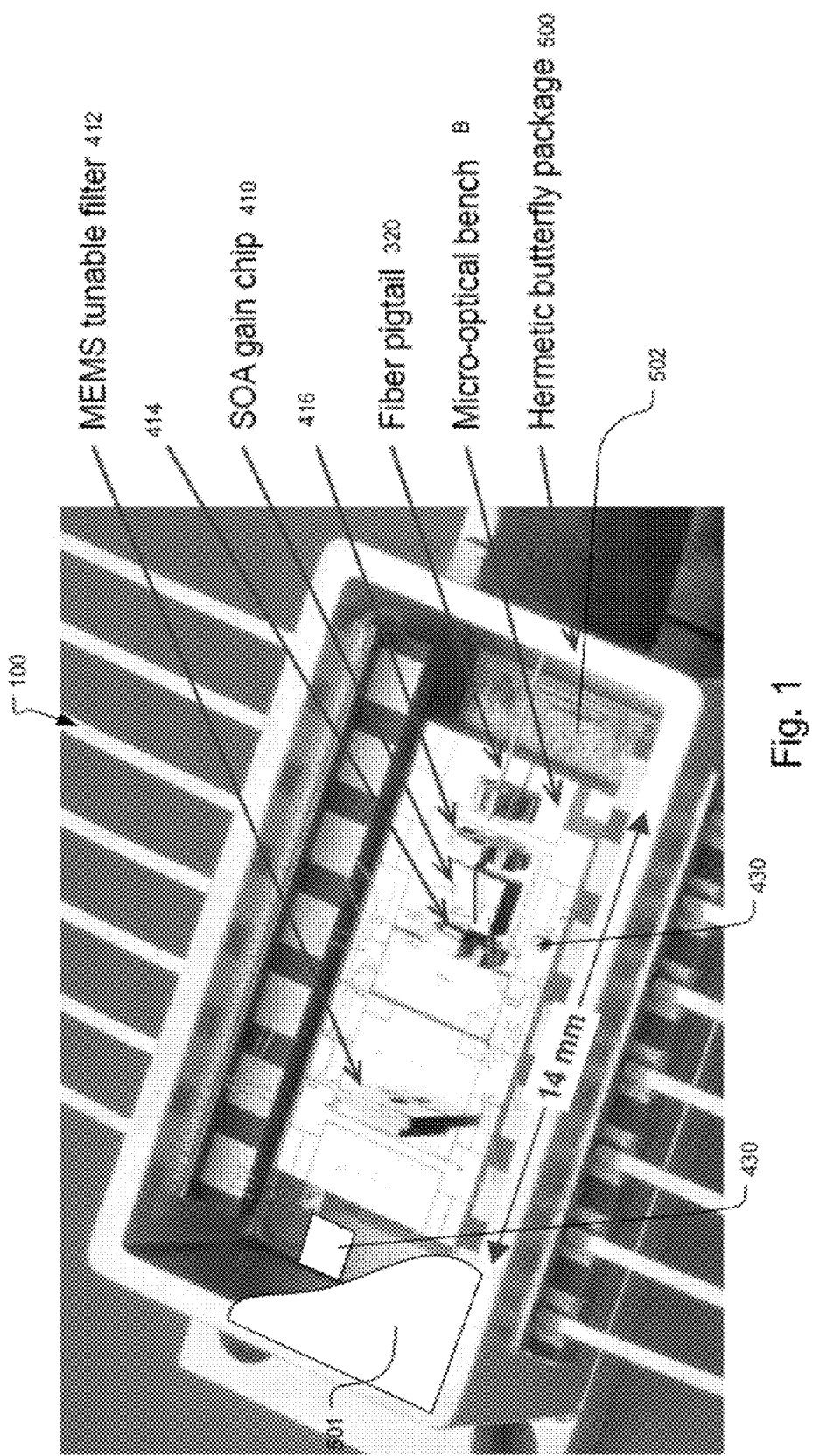
FIG. 1 is a top perspective view of an external cavity tunable laser swept source for optical coherence analysis according to a first embodiment the present invention in which the lid is cut-away to show the other components.

FIG. 1 shows an external cavity tunable laser swept source 100 for optical coherence analysis, which has been constructed according to the principles of the present invention.

In the current embodiment, the laser swept source 100 is preferably a laser as generally described in incorporated U.S. Pat. No. 7,415,049 B1. It includes a linear cavity with a gain element and a Fabry-Perot filter frequency tuning element defining one end of the cavity. Currently, the wavelength for OCT tunable laser is centered roughly on 1060 nanometers (nm) and tunes over about 970-1100 nm.

In other embodiments, other cavity configurations are used such as ring cavities. Further other cavity tuning elements are used such as gratings. These elements can also be located entirely within the cavity such as an angle isolated Fabry-Perot tunable filter or grating.

In more detail with respect to the illustrated embodiment, the tunable laser 100 comprises an edge-emitting semiconductor gain chip 410 that is paired with a micro-electro-mechanical (MEMS) angled reflective Fabry-Perot tunable filter 412, which defines one end of the laser cavity. The cavity extends to a second output reflector that is located in the package or in fiber pigtail 320 that is coupled to the bench B and also forms part of the cavity.

Light passing through the output reflector is transmitted on optical fiber 320 or via free space to an interferometer 50 of the OCT system described below.

The semiconductor optical amplifier (SOA) chip 410 is located within the laser cavity. In the current embodiment, input and output facets of the SOA GaAs chip 410 are angled and anti-reflection (AR) coated, providing parallel beams from the two facets. In the preferred embodiment, the SOA chip 410 is bonded or attached to the common bench B via a submount.

Each facet of the SOA 410 has an associated lens structure 414, 416 that is used to couple the light exiting from either facet of the SOA 410. The first lens structure 414 couples the light between the back facet of the SOA 410 and the reflective Fabry-Perot tunable filter 412. Light exiting out the output or front facet of the SOA 410 is coupled by the second lens structure 416 to a fiber end facet of the pigtail 320.

Each lens structure comprises a LIGA mounting structure, which is deformable to enable post installation alignment, and a transmissive substrate on which the lens is formed. The transmissive substrate is typically solder or thermocompression bonded to the mounting structure, which in turn is solder bonded to the optical bench B.

The fiber facet of the pigtail 320 is also preferably mounted to the bench B via a fiber mounting structure, to which the fiber 320 is solder bonded. The fiber mounting structure is likewise usually solder bonded to the bench B.

The angled reflective Fabry-Perot filter 412 is a multi-spatial-mode tunable filter that provides angular dependent reflective spectral response back into the laser cavity. This characteristic is discussed in more detail in incorporated U.S. Pat. No. 7,415,049 B1.

Preferably, the tunable filter 412 is a Fabry-Perot tunable filter that is fabricated using micro-electro-mechanical systems (MEMS) technology and is attached, such as directly solder bonded, to the bench B. Currently, the filter 412 is manufactured as described in U.S. Pat. Nos. 6,608,711 or 6,373,632, which are incorporated herein by this reference. A curved-flat resonator structure is used in which a generally flat mirror and an opposed curved mirror define a filter optical cavity, the optical length of which is modulated by electrostatic deflection of at least one of the mirrors.

In another implementation, a tunable VCSEL technology is used in the tunable laser 100. In such cases, the filter 412 or deflectable MEMS membrane is integrated together with the gain chip 410 that is a vertical surface emitting laser chip. Often these devices are optically pumped. In such cases, a pump laser diode is further integrated on the bench B.

The tunable laser 100 on the bench B is installed within a hermetic package 500.

The laser swept source 100 and the other embodiments discussed hereinbelow are generally intended for high speed tuning to generate a tunable or swept optical signal that scans over the scanband at speeds greater than 10 kiloHertz (kHz). In current embodiments, the laser swept source 100 tunes at speeds greater than 50 or 100 kHz by tuning the tunable filter 412. In very high speed embodiments, the laser swept source 100 tunes at speeds greater than 200 or 500 kHz, or faster.

The tuning speed can also be expressed in wavelength per unit time. In one example, for an approximately 110 nm tuning range or scan band around 1060 nm and 100 kHz scan rate, assuming 60% duty cycle for substantially linear up-tuning, the peak sweep speed would be 110 nm*100 kHz/ 0.60=18,300 nm/msec=18.3 nm/μsec or faster. In another example, for an approximately 90 nm tuning range and 50 kHz scan rate, assuming a 50% duty cycle for substantially linear up-tuning, the peak sweep speed is 90 nm*50 kHz/ 0.50=9,000 nm/msec=9.0 nm/μsec or faster. In a smaller scan band example having an approximately 30 nm tuning range and 2 kHz scan rate, assuming a 80% duty cycle for substantially linear tuning, the peak sweep speed would be 30 nm*2 kHz/0.80=75 nm/msec=0.075 nm/μsec, or faster.

Thus, in terms of scan rates, in the preferred embodiments described herein, the sweep speeds are greater than 0.05 nm/μsec, and preferably greater than 5 nm/μsec. In still higher speed applications, the scan rates are higher than 10 nm/μsec.

The bench B is termed a micro-optical bench and is preferably less than 10 millimeters (mm) in width and about 25 mm in length or less. This size enables the bench to be installed in a standard, or near standard-sized, butterfly or DIP (dual inline pin) hermetic package 500. In one implementation, the bench B is fabricated from aluminum nitride. A thermoelectric cooler 502 is disposed between the bench B and the package 500 (attached/solder bonded both to the backside of the bench and inner bottom panel of the package) to control the temperature of the bench B. The bench temperature is detected via a thermistor 430 installed on the bench B.

Dry oxygen, or other gases such as ozone, is sealed within the hermetic package 500 of the external cavity laser 100 to avoid packaging-induced failure (PIF). The gas or gases are added during the process of lid sealing where the lid 501 is sealed on the package 500. PIF due to hydrocarbon breakdown at optical interfaces with high power densities is believed to occur at the SOA facets as well as the tunable Fabry-Perot reflector/filter elements 412 and micro lens elements 414, 416 and/or the facet of the output fiber 320.

In one embodiment, the oxygen content within the package is about 20%, or preferably between 10-50%.

In other embodiments, PIF is minimized by exposing the hermetic package 500 to an ozone cleaning prior to lid sealing to eliminate trace organics. Further, the packages are preferably baked at 200 C-250 C for roughly 100 hrs to drive out residual hydrogen from the package manufacturing process. Hydrogen can be problematic when lid sealing with oxygen present, since it combines with the oxygen to produce internal moisture. Moisture in the presence of oxygen will result in corrosion, especially of metal joints, like solders and Thermoelectric coolers.

A moisture getter 432 is included in the package 500. In one embodiment, it is applied to the bottom of the lid 501 or within the package in some other form, such as pellets, to reduce the internal moisture. In some examples, the getter or another getter is used to reduce hydrogen and/or volatile organics and is also applied to the inside of the lid 501 or elsewhere inside the package.

The present invention is also relevant to other types of swept sources including non-laser sources.

Figure 2:
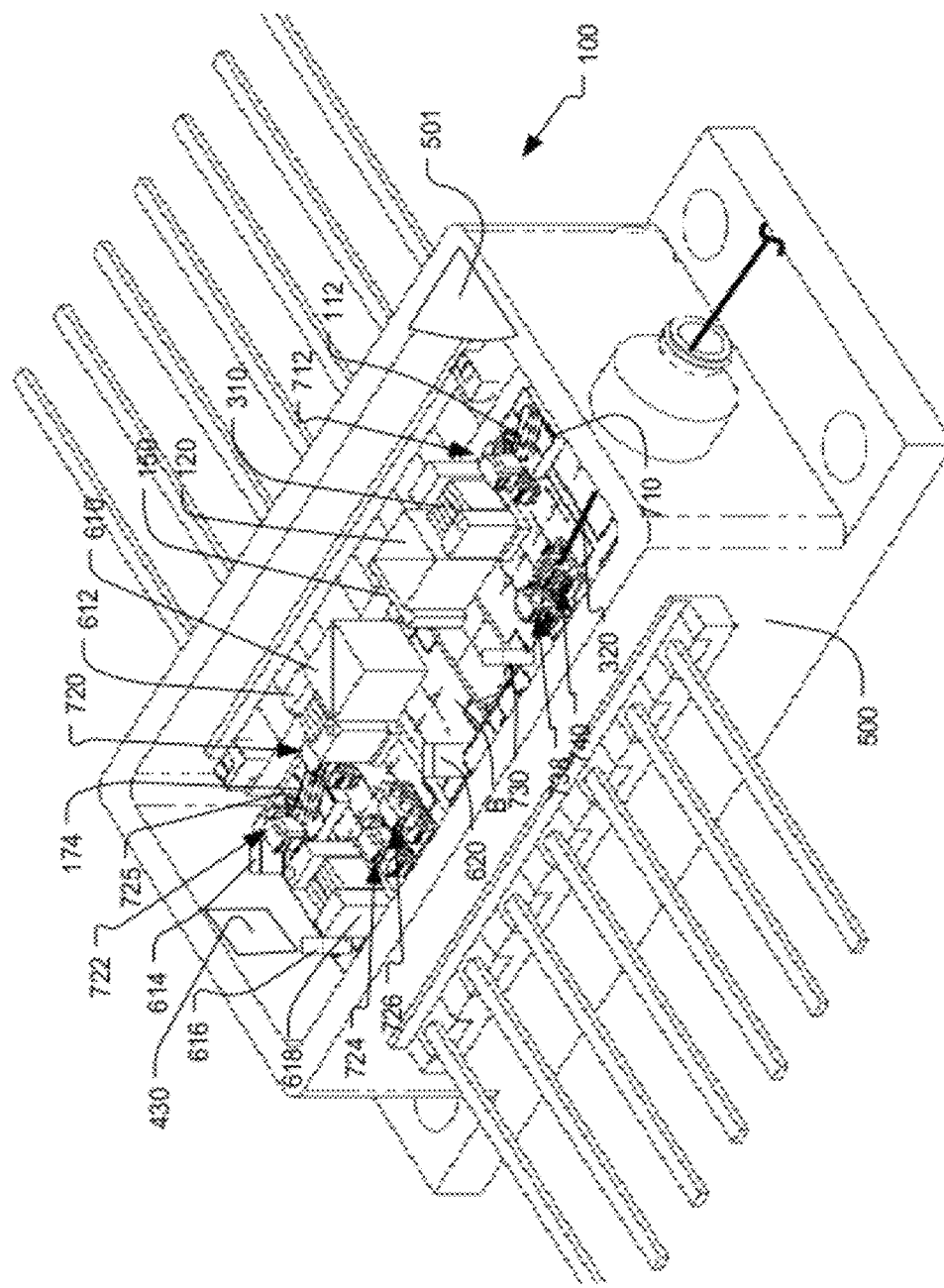
FIG. 2 is a top perspective view of an ASE swept source for optical coherence analysis according to a second embodiment the present invention in which the lid is cut-away to show the other components.

FIG. 2 shows a non-laser swept source 100 for optical coherence analysis, which has been constructed according to the principles of the present invention.

The specific illustrated example is a swept source 100 with contra-directional self tracking filter using polarization diversity and a loop amplification stage. It shows the coupling optics, lenses, that are used to couple the optical signal in and out of the elements on the bench B and the installation of the bench in a hermetic package 500. The lid 501 of the package 500 is cutaway to expose the optical elements.

The edge-emitting broadband source 112 generates the broadband signal. In the illustrated embodiment, the broadband source 112 is implemented as a semiconductor gain chip such as a super luminescent light emitting diode (SLED) or SOA implemented as a SLED. In the illustrated example, the semiconductor gain chip is secured to a submount 710, which is bonded to the bench B. The light exiting from the broadband source 112 is collimated by a first lens component 712. As described previously, the lens components preferably comprise lens substrates that are bonded to mounting structures, which in turn are mounted to the bench B.

The broadband signal then is transmitted through an isolator 310. This prevents back reflections into the broadband source 112 and thus lasing.

The typically horizontally polarized light from the broadband source 112 is transmitted through the PBS 120. A MEMS Fabry-Perot tunable filter 150, as described previously see reference number 412 of FIG. 1, then converts the broadband signal 114 into the narrowband tunable signal in a transmissive implementation. A loop PBS 610 transmits the tunable signal to a first loop isolator 612. A second lens component 720 couples the tunable optical signal into SOA semiconductor gain chip 174 which is the optical amplifier in the loop. The SOA 174 is preferably mounted onto the bench 110 by a submount 725.

Light exiting the SOA 174 is collimated by a third lens component 722 in the loop. Two subsequent fold mirrors 614 and 616 redirect the tunable swept optical signal. The tunable optical signal is then transmitted through a second loop isolator 618 and two lens components: a fourth lens component 724 and a fifth lens component 726. A fold mirror 620 returns the tunable optical signal to the loop PBS 610. The second loop isolator 618 rotates the polarization of the tunable optical signal by 90° from horizontal to vertical polarization. As a result, the tunable optical signal received by the loop PBS 610 is reflected back to the tunable filter 150.

The tunable optical filter 150 again filters the tunable optical signal 154 applying its bandpass filter function. In passing through the tunable filter 150 this second time, light is propagating in the opposite direction and with orthogonal polarization to the first passage. The vertical polarization of the tunable optical signal from the tunable filter is reflected by the PBS 120 as the output signal.

The output signal path is folded to yield a compact design. In more detail, a fold mirror 730 reflects the output signal 190 to a direction parallel to the original broadband signal 114. A sixth lens component 738 focuses the light onto the entrance facet of an optical fiber 320. The fiber entrance facet is secured to the optical bench 110 via a fiber mounting structure 740.

These non-laser ASE swept sources 100 are tuned over the scan band as describe previously with respect to the laser of FIG. 1. The ASE sources are 100 also at risk for PIF related failures. High optical powers are present at the facets of the SLED 112 and the SOA 174 along with the resonant optical filter 150. So here also dry oxygen, or other gases such as ozone that will react with carbon, is sealed within the hermetic package 500 of the swept source 100 as described previously. In one embodiment, the oxygen content within the package is about 20%, or preferably between 10-50%. The packages are also preferably cleaned as described previously. Further, a moisture getter 430 is also applied to the bottom of the lid of the package 500 or within the package 500. In some examples, the getter or another getter is used to reduce hydrogen and/or volatile organics and is also applied to the lid or elsewhere in the package 500.

The particular non-laser swept source 100 shown in FIG. 2 is illustrative. In other embodiments, other variants are used such as those described in U.S. Pat. Appl. Publ. No. US 2011/0051143 A1, which is incorporated herein by this reference in its entirety.

Figure 3:
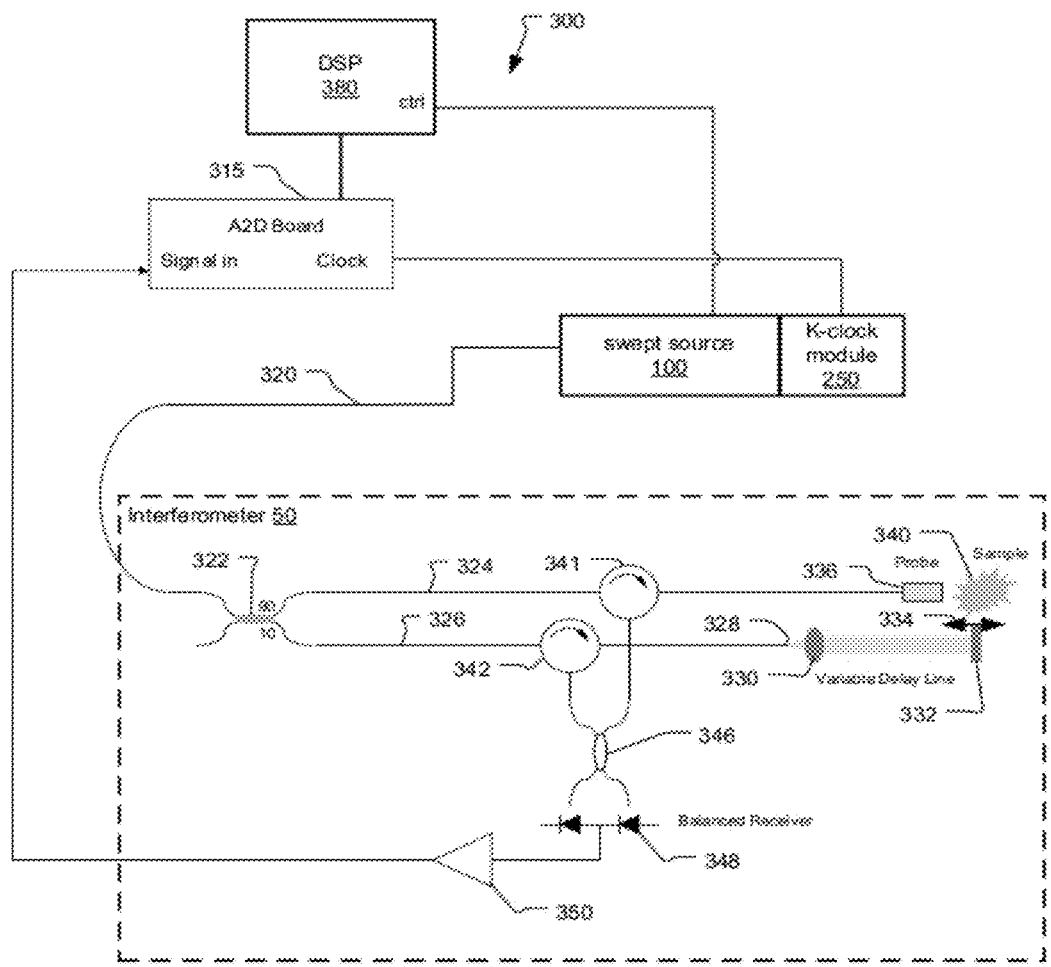
FIG. 3 is a schematic view of an OCT system incorporating the swept source according to an embodiment of the invention.

FIG. 3 shows an optical coherence analysis system 300 using the swept source 100, which has been constructed according to the principles of the present invention.

The laser or non-laser swept source 100 generates a tunable swept optical signal on optical fiber 320 that is transmitted to interferometer 50. The tunable optical signal scans over a scanband with a narrowband emission.

Preferably, a k-clock module 250 is used to generate a clocking signal at equally spaced optical frequency increments as the optical signal is tuned over the scan band.

In the current embodiment, a Mach-Zehnder-type interferometer 50 is used to analyze the optical signals from the sample 340. The tunable signal from the source 100 is transmitted on fiber 320 to a 90/10 optical coupler 322. The combined tunable signal is divided by the coupler 322 between a reference arm 326 and a sample arm 324 of the system.

The optical fiber of the reference arm 326 terminates at the fiber endface 328. The light exiting from the reference arm fiber endface 328 is collimated by a lens 330 and then reflected by a mirror 332 to return back, in some exemplary implementations.

The external mirror 332 has an adjustable fiber to mirror distance (see arrow 334), in one example. This distance determines the depth range being imaged, i.e. the position in the sample 340 of the zero path length difference between the reference arm 326 and the sample arm 324. The distance is adjusted for different sampling probes and/or imaged samples. Light returning from the reference mirror 332 is returned to a reference arm circulator 342 and directed to a 50/50 fiber coupler 346.

The fiber on the sample arm 324 terminates at the sample arm probe 336. The exiting light is focused by the probe 336 onto the sample 340. Light returning from the sample 340 is returned to a sample arm circulator 341 and directed to the 50/50 fiber coupler 346. The reference arm signal and the sample arm signal are combined in the fiber coupler 346 to generate an interference signal. The interference signal is detected by a balanced receiver, comprising two detectors 348, at each of the outputs of the fiber coupler 346. The electronic interference signal from the balanced receiver 348 is amplified by amplifier 350.

An analog to digital converter system 315 is used to sample the interference signal output from the amplifier 350. Frequency clock and sweep trigger signals derived from the k-clock module 250 of the swept source 100 are used by the analog to digital converter system 315 to synchronize system data acquisition with the frequency tuning of the swept source system 100.

Once a complete data set has been collected from the sample 340 by spatially raster scanning the focused probe beam point over the sample, in a Cartesian geometry, x-y, fashion or a cylindrical geometry theta-z fashion, and the spectral response at each one of these points is generated from the frequency tuning of the swept source 100, the digital signal processor 380 performs a Fourier transform on the data in order to reconstruct the image and perform a 2D or 3D tomographic reconstruction of the sample 340. This information generated by the digital signal processor 380 can then be displayed on a video monitor.

In one application, the probe is inserted into blood vessels and used to scan the inner wall of arteries and veins. In other examples, other analysis modalities are included in the probe such as intravascular ultrasound (IVUS), forward looking IVUS (FLIVUS), high-intensity focused ultrasound (HIFU), pressure sensing wires and image guided therapeutic devices.

While this invention has been particularly shown and described with references to preferred embodiments thereof, it will be understood by those skilled in the art that various changes in form and details may be made therein without departing from the scope of the invention encompassed by the appended claims. For example, although the invention has been described in connection with an OCT or spectroscopic analysis.

What is claimed is:

1. A swept source, comprising:
   a hermetic package;
   an optical bench within the hermetic package;
   a semiconductor gain chip installed on the optical bench for generating light;
   a tunable filter installed on the bench for filtering the light from the semiconductor gain chip to generate a swept optical signal that is swept through a scan band including a wavelength of 1060 nanometers at sweep speeds of greater than 5 nanometers per microsecond and has an output power of less than 50 mW; and
   an atmosphere within the hermetic package that contains oxygen.

2. A source as claimed in claim 1, wherein the atmosphere within the hermetic package contains at least 10% oxygen.

3. A source as claimed in claim 1, comprising a getter in the hermetic package.

4. A source as claimed in claim 3, wherein the getter captures moisture.

5. A source as claimed in claim 3, wherein the getter captures hydrogen or hydrocarbons.

6. A source as claimed in claim 3, wherein the getter is in the form of pellets.

7. A source as claimed in claim 3, wherein the getter is applied to a lid of the hermetic package.

8. A source as claimed in claim 1, further comprising at least two semiconductor gain chips installed on the bench.

9. A source as claimed in claim 1, wherein the semiconductor gain chip is an edge emitting chip.

10. A source as claimed in claim 1, wherein the semiconductor gain chip is a VCSEL chip.

11. A source as claimed in claim 1, wherein the tunable filter is a resonant optical filter.

12. A source as claimed in claim 1, wherein the tunable filter is a MEMS Fabry-Perot tunable filter.

13. A source as claimed in claim 1, wherein the swept optical signal is received by an interferometer.

14. A source as claimed in claim 13, wherein a sample is placed on one arm of the interferometer.

15. A source as claimed in claim 13, wherein light from a sample arm and a reference arm of the interferometer is combined and detected in order to generate optical coherence tomography information.

* * * * *